United States Patent
Bhalla et al.

(10) Patent No.: US 7,952,139 B2
(45) Date of Patent: May 31, 2011

(54) ENHANCING SCHOTTKY BREAKDOWN VOLTAGE (BV) WITHOUT AFFECTING AN INTEGRATED MOSFET-SCHOTTKY DEVICE LAYOUT

(75) Inventors: Anup Bhalla, Santa Clara, CA (US); Xiaobin Wang, San Jose, CA (US); Moses Ho, Campbell, CA (US)

(73) Assignee: Alpha & Omega Semiconductor Ltd. (BM)

( * ) Notice: Subject to any disclaimer, the term of this patent is extended or adjusted under 35 U.S.C. 154(b) by 143 days.

(21) Appl. No.: 12/217,092

(22) Filed: Jun. 30, 2008

(65) Prior Publication Data

US 2008/0265312 A1    Oct. 30, 2008

Related U.S. Application Data

(63) Continuation-in-part of application No. 11/413,249, filed on Apr. 29, 2006, now Pat. No. 7,436,022, which is a continuation-in-part of application No. 11/056,346, filed on Feb. 11, 2005, now Pat. No. 7,285,822.

(51) Int. Cl.
*H01L 29/66* (2006.01)

(52) U.S. Cl. .............. 257/330; 257/476; 257/E27.04; 257/E29.013

(58) Field of Classification Search .............. 257/330, 257/334, E27.04, E29.013, 475, 476, 484
See application file for complete search history.

(56) References Cited

U.S. PATENT DOCUMENTS

| | | | | |
|---|---|---|---|---|
| 4,063,964 | A * | 12/1977 | Peressini et al. | 438/534 |
| 4,646,115 | A * | 2/1987 | Shannon et al. | 257/484 |
| 6,921,957 | B2 * | 7/2005 | Zeng et al. | 257/476 |
| 2004/0178444 | A1 * | 9/2004 | Blanchard | 257/328 |

* cited by examiner

*Primary Examiner* — Lex Malsawma
(74) *Attorney, Agent, or Firm* — Bo-In Lin

(57) ABSTRACT

This invention discloses a semiconductor power device that includes an active cell area having a plurality of power transistor cells. Each of said power transistor cells has a planar Schottky diode that includes a Schottky junction barrier metal covering areas above gaps between separated body regions between two adjacent power transistor cells. The separated body regions further provide a function of adjusting a leakage current of said Schottky diode in each of said power transistor cells. Each of the planar Schottky diodes further includes a Shannon implant region disposed in a gap between the separated body regions of two adjacent power transistor cells for further adjusting a leakage current of said Schottky diode. Each of the power transistor cells further includes heavy body doped regions in the separated body regions next to source regions surrounding said Schottky diode forming a junction barrier Schottky (JBS) pocket region.

18 Claims, 18 Drawing Sheets

ENHANCING SCHOTTKY BREAKDOWN VOLTAGE (BV) WITHOUT AFFECTING AN INTEGRATED MOSFET-SCHOTTKY DEVICE LAYOUT

This patent application is a Continuation in Part (CIP) Application of a application with a Ser. No. 11/413,249 filed by a common inventor of this application on Apr. 29, 2006 now U.S. Pat. No. 7,436,022. The patent application Ser. No. 11/413,249 is a Continuation in Part Application (CIP) of a patent application Ser. No. 11/056,346 filed by a common Inventor of this application on Feb. 11, 2005 now U.S. Pat. No. 7,285,822. The Disclosures made in patent application Ser. Nos. 11/413,249 and 11/056,346 are hereby incorporated by reference.

BACKGROUND OF THE INVENTION

1. Field of the Invention

The invention relates generally to the semiconductor power devices. More particularly, this invention relates to an improved and novel manufacturing process and device configuration for providing the MOSFET device with Schottky source contact having a higher breakdown voltage for improving performance of high frequency power switching, H-bridge and synchronization rectification applications without affecting layout of the integrated MOSFET-Schottky device.

2. Description of the Related Art

In order to reduce the power consumptions and to increase the switching speed of a power semiconductor power device, it is desirable to further reduce the on-resistance and the gate capacitance. Integration of an Schottky diode in a semiconductor power device such as a metal oxide silicon field effect transistor (MOSFET) has been implemented. FIGS. 1A and 1B show the standard MOSFET devices that integrate the Schottky diodes to bypass the body diode thus improving the behavior of a MOSFET device. Improvements in the MOSFET device performances enhance the H-bridge and synchronization rectification applications. Specifically, FIG. 1A shows a MOSFET with an integrated Junction Barrier controlled Schottky (JBS) area. The integrated JBS may be a Schottky diode array with a P-N junction grid interspersed between the Schottky contacts. The P-N junction will pinch-off the channel regions under the Schottky contacts to inhibit the formation of large reverse leakage current once a threshold reverse-biased voltage is applied. The shielding effect caused by the depletion layer also improves the breakdown voltage. However, there is a tradeoff that due to an increase of the series resistance. Also, since the presence of P-N junction in the integrated JBS regions takes up a large portion of surface area, for practical considerations, it may be required to reduce the overall Schottky contact areas dedicated to the forward conduction. Under that circumstance, there is an increase of the on-state forward voltage drop cause by this reduction of the overall Schottky contact area. In FIG. 1B, the integrated trench MOS barrier Schottky (TMBS) is implemented. The integrated TMBS includes Schottky diode array interspersed with MOS trench. The charge coupling between the majority charge carrier in the mesa-shaped portion of the epitaxial/drift region and the metal on the insulated sidewalls of the trenches causes a redistribution of the electric filed profile under the Schottky contact which improves the breakdown and reduces reverse leakage current.

U.S. Pat. No. 4,675,713 discloses a method of using the source Schottky junction as the body contact for a semiconductor power device. U.S. Pat. No. 4,983,535 discloses a fabrication method to manufacture a DMOS device with a source implemented with a refractory metal Schottky barrier located on top of the body region. However, these devices still have the limitations of using metals of relatively high barrier height. The device performance cannot satisfy the modern applications that require further reduction on resistance and higher drive currents.

FIG. 2 shows an improved DMOS submitted as a co-pending Application by co-inventors of this patent application. The DMOS has an improved configuration. Specifically, in proximity of the gate trench and adjacent to the source, there is a source-body contact trench with an anti-punch through implant disposed along the trench wall. An integrated Schottky diode is formed by depositing a high barrier height metal at the bottom of the source-body contact trench to function as the integrated Schottky contacts. A low barrier height metal is further deposited overlaying the high barrier height metal to provide ohmic contact for source and body. The DMOS device as shown in FIG. 2 provides the advantage of integrating a Schottky in every cell with no loss of die active area to form such a Schottky as in older approach. However, the high barrier height metal as required to achieve acceptable low leakage current in the off state presents a disadvantage due to the higher costs of depositing both the high barrier height metal and the low barrier height metal to meet the requirements of Schottky and source-body ohmic contact.

Additionally, the above device configurations as shown in FIGS. 1A, 1B and 2 are still limited by a breakdown vulnerability at bottom corners of the P+ pocket regions as that shown in FIGS. 1C and 1D. The breakdown vulnerability at the bottom corners at the body type dopant (P+ pocket) regions is due to a small radius of a curvature at the junction near the bottom corners of the P+ pocket regions. Furthermore, there is an abrupt dopant distribution reversal profile as that shown in FIG. 1D. FIG. 1D compares the variation of the doping profile in the JBS P+ pocket region to the doping profile in the MOSFET P body regions along two vertical lines A-A' and B-B' shown on FIG. 1C.

A co-inventor of this patent application filed another patent application Ser. No. 11/413,249 that disclosed an improved semiconductor power device. The semiconductor power device, as disclosed in the patent application Ser. No. 11/413,249, is integrated with Schottky diode to increase the breakdown voltage of the device by resolving the breakdown vulnerability at the bottom corners of the P+ pocket regions without changing the layout of the MOSFET devices that integrated with the Schottky diode for performance improvements. Specifically, the semiconductor power device is formed with the Junction Barrier controlled Schottky (JBS) rectifiers in the Schottky area with improved doping profile to increase the breakdown voltage without affecting the MOSFET cell performance. Additionally, the JBS rectifiers are implemented with stripe, square closed cells, circular closed cells and hexagonal closed cells configurations. The JBS rectifiers in the Schottky area also has a maximized Schottky area by forming the gate fingers as a comb shape with a bottom peripheral gate runner and not running the peripheral gate bus all the way around the die. The details of various configurations are fully described in the application Ser. No. 11/413,249 and are hereby incorporated by reference and also as part of this patent application below.

The devices with various improved configurations integrated with the Schottky diodes as described above however require a separate Schottky area. The manufacturing processes are more complicate when such Schottky area, different from the active cell area, has to be particularly configured.

A separate Schottky area also leads to large die size in order to integrate the Schottky diodes with the semiconductor power devices.

Therefore, a need still exists in the art of power semiconductor device design and manufacture to provide new manufacturing method and device configuration in forming the semiconductor power devices such that the above discussed problems and limitations can be resolved.

SUMMARY OF THE PRESENT INVENTION

It is therefore an aspect of the present invention to provide a new and improved semiconductor power device integrated with Schottky diode by implementing Schottky contact in every cell as planar contact for the MOSFET device thus simplified the manufacturing processes and reduced the required areas by eliminating the requirement of a special Schottky area for the semiconductor power device.

Another aspect of this invention is to provide a new and improved semiconductor power device integrated with the Schottky diodes by implementing Schottky contact in every cell and tuning the Schottky diode leakage current by applying a p-type Shannon implant with either boron or BF2 ions with an ion flux in a range substantially between 2e11~1e13 and with an implanting energy in a range substantially between 10~80 keV.

Another aspect of this invention is to provide a new and improved semiconductor power device integrated with the Schottky diodes by implementing Schottky contact in every cell wherein the device performance is significantly improved because the diode reverse recovery characteristics and silicon efficiency are greatly improved.

Another aspect of this invention is to provide a new and improved semiconductor power device integrated with the Schottky diodes by implementing Schottky contact in every cell between gapped body regions wherein a body block regions are formed on the edge of the Schottky contact to prevent high dose body dopant to implant into the Schottky contact regions to assure proper functioning of the Schottky diodes formed in each active transistor cell.

Briefly in a preferred embodiment this invention discloses a semiconductor power device that includes an active cell area having a plurality of power transistor cells. Each of said power transistor cells has a planar Schottky diode that includes a Schottky junction barrier metal covering areas above gaps between separated body regions between two adjacent power transistor cells. The separated body regions further provide a function of adjusting a leakage current of said Schottky diode in each of said power transistor cells. Each of the planar Schottky diodes further includes a Shannon implant region disposed in a gap between the separated body regions of two adjacent power transistor cells for further adjusting a leakage current of said Schottky diode. Each of the power transistor cells further includes heavy body doped regions in the separated body regions next to source regions surrounding said Schottky diode forming a junction barrier Schottky (JBS) pocket region.

According to the above descriptions, this invention discloses a method for manufacturing a semiconductor power device to form an active cell area with a plurality of power transistor cells by first forming the power transistor cells in the active cell area with separated body regions having gaps between two adjacent power transistors. The method further includes a step of forming a planar Schottky diode in each of the power transistor cells by depositing a Schottky junction barrier metal covering areas above the gaps between separated body regions for applying the separated body regions to adjust a leakage current of the Schottky diode in each of the power transistor cells. In an exemplary embodiment, the step of forming the planar Schottky diodes further includes a step of carrying out a shallow Shannon implant to form a Sharon implant region in the gaps between the separated body regions of two adjacent power transistor cells for adjusting a leakage current of the Schottky diode.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
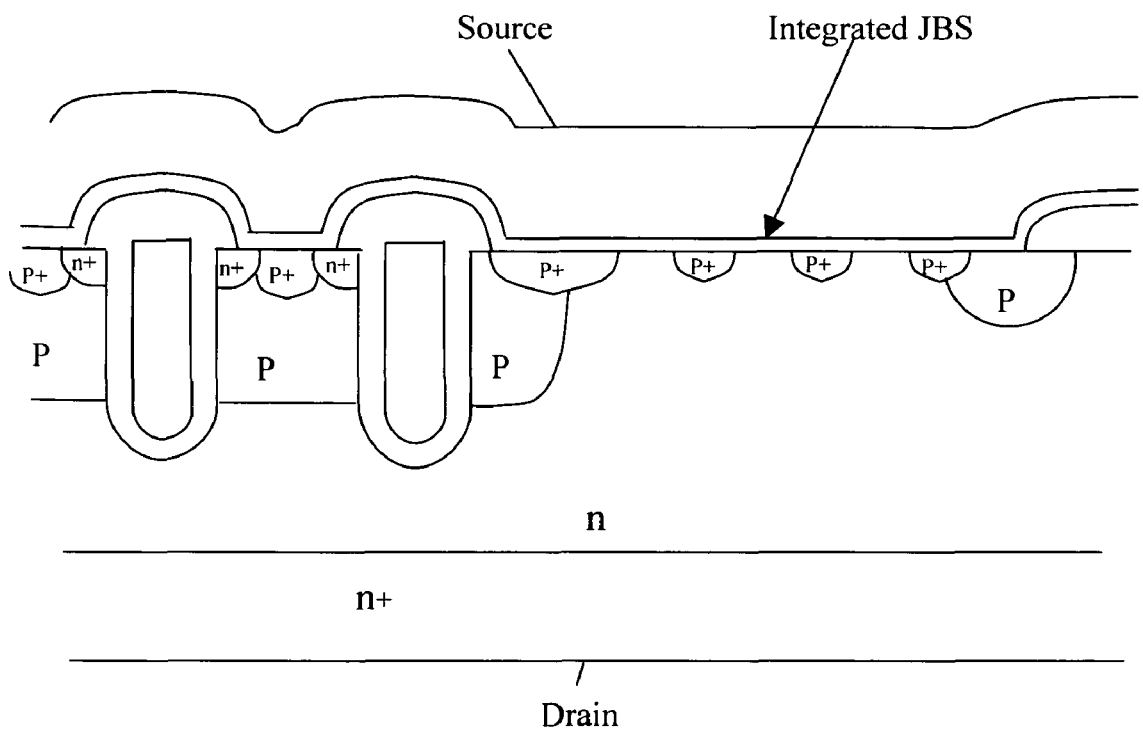
FIG. 1A is a cross sectional view of a conventional trenched MOSFET power device with an integrated Junction Barrier controlled Schottky area.
Figure 1B:
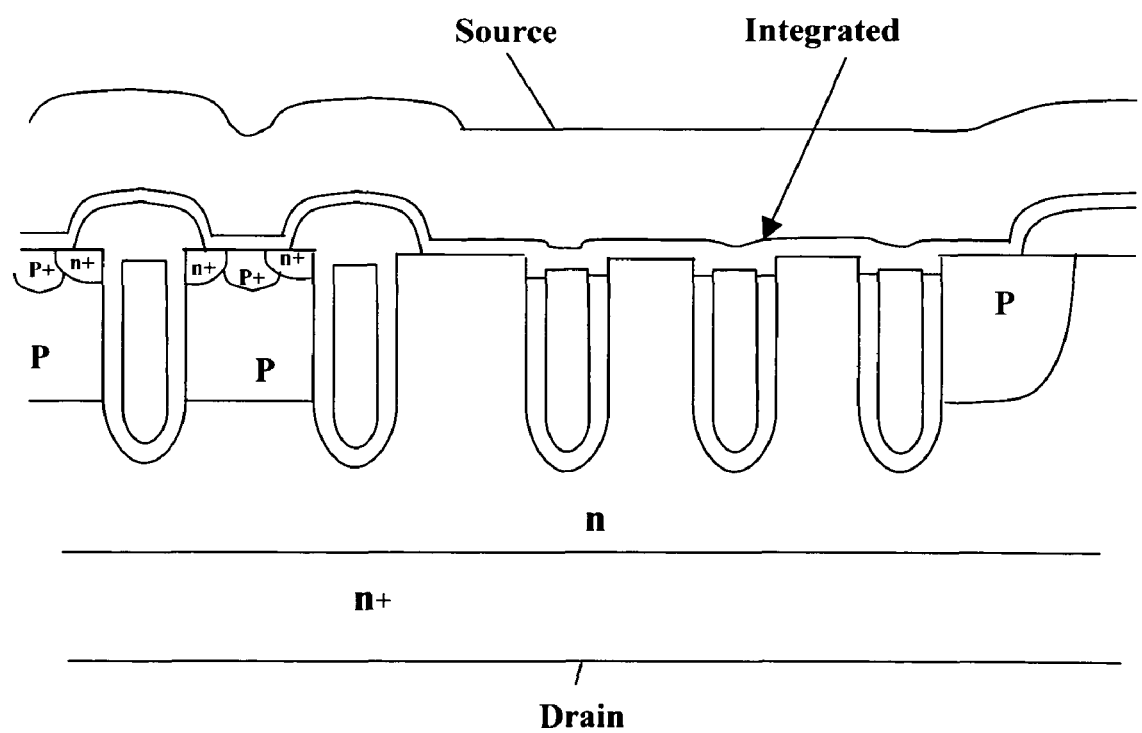
FIG. 1B is a cross sectional view of another conventional trenched MOSFET power device with the integrated Trench MOS Barrier controlled Schottky (TMBS).
Figure 1C:
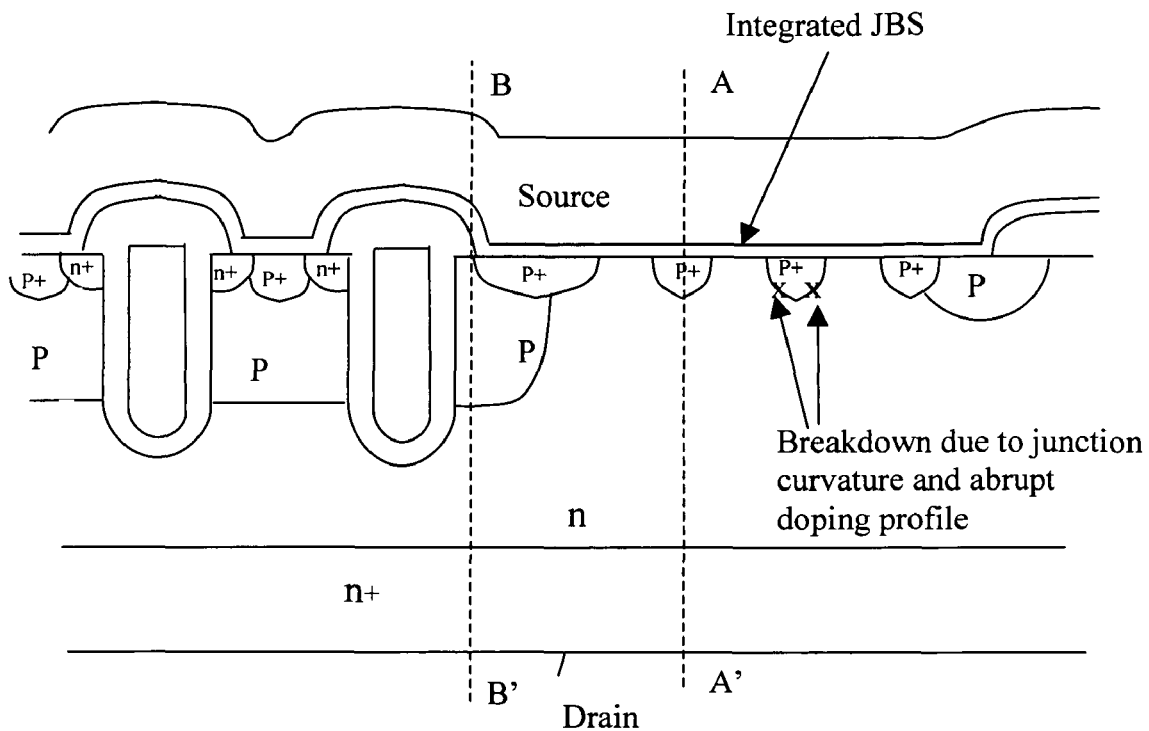
FIG. 1C is a cross sectional view of a conventional trenched MOSFET power device with an integrated JBS area with the breakdown vulnerable points at the bottom corners of the body-type dopant (P+ pocket) regions.
Figure 1D:
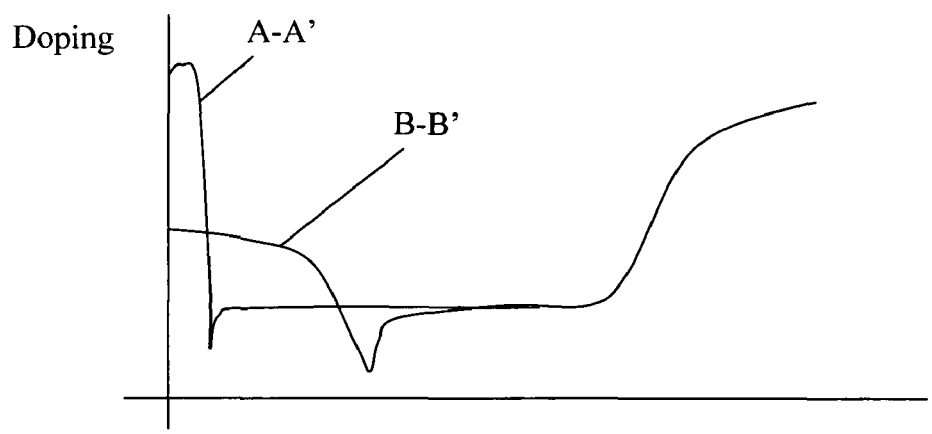
FIG. 1D is a dopant concentration diagram along a vertical direction in the P+ pocket region and the MOSFET body regions of FIGS. 1A and 1B for illustrating the reasons of breakdown vulnerability.
Figure 2:
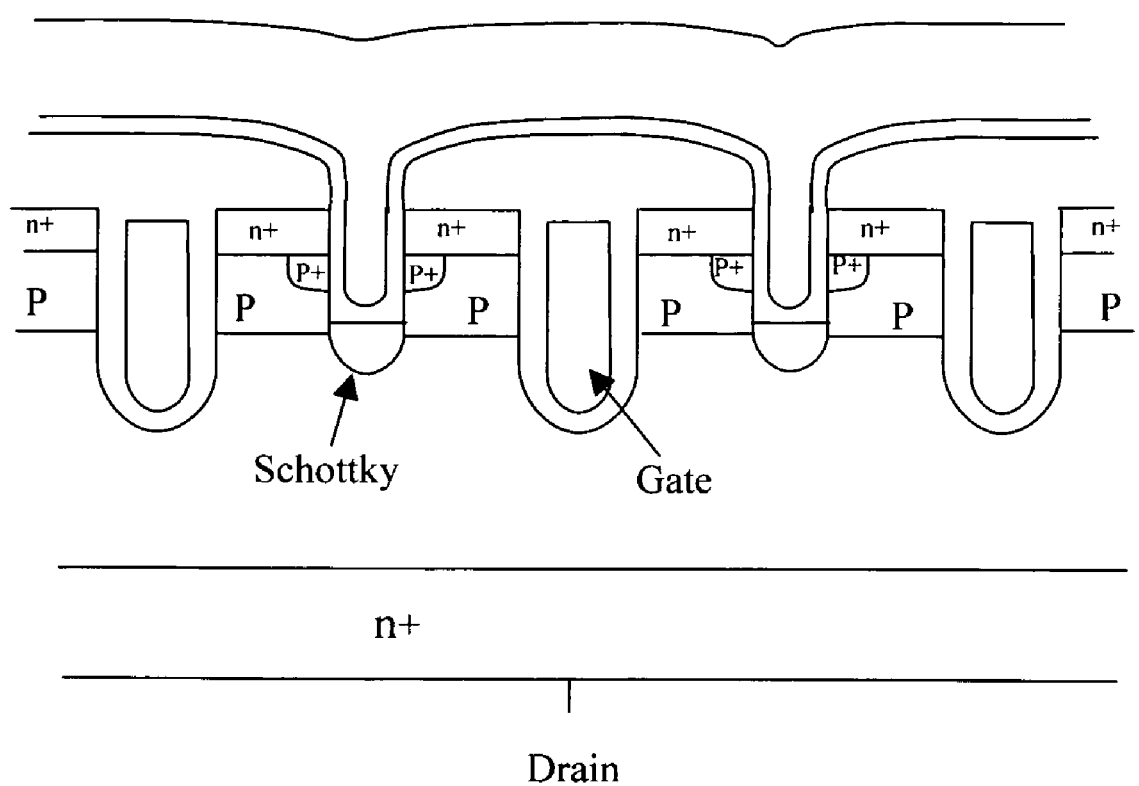
FIG. 2 shows is a cross sectional view of an improved DMOS of a co-pending Application by co-inventors of this patent application.
Figure 3A:
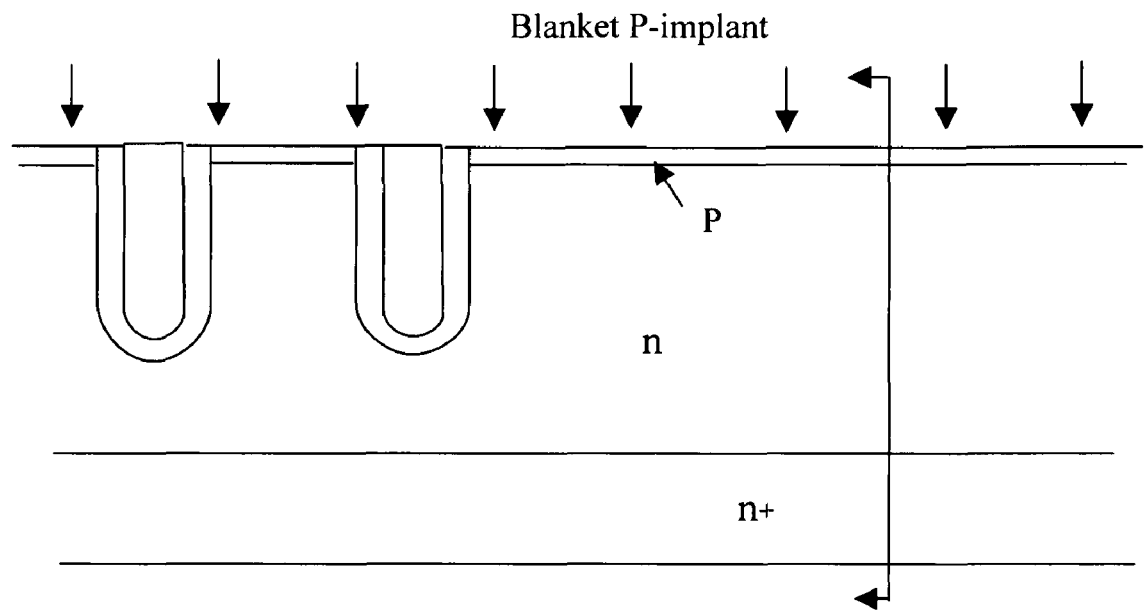
FIGS. 3A and 3B are side cross sectional views before and after the diffusion operation of a MOSFET device of this invention.
Figure 3B:
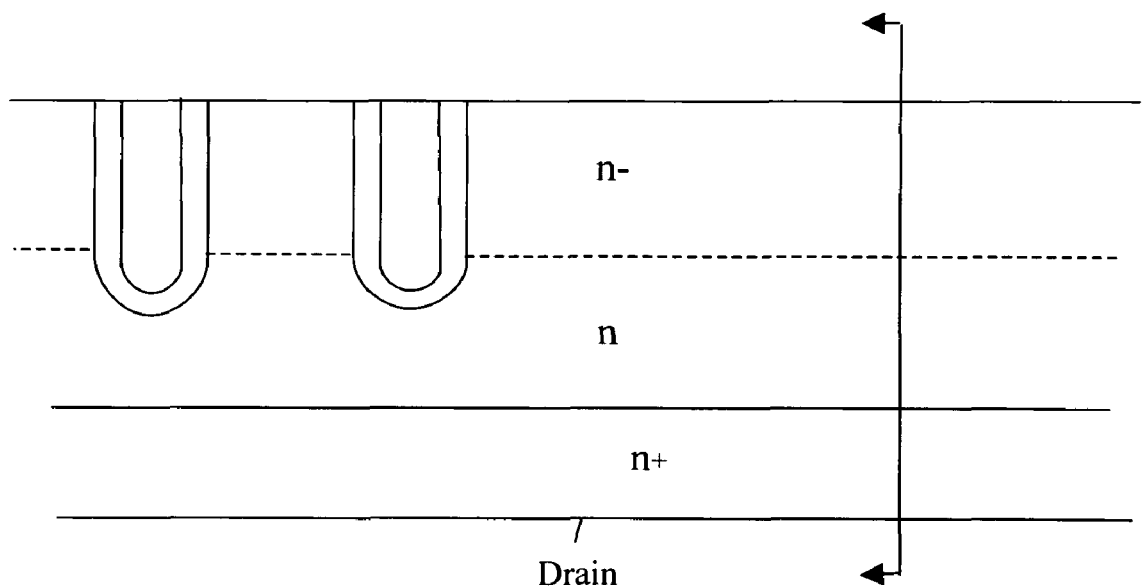
Figure 3C:
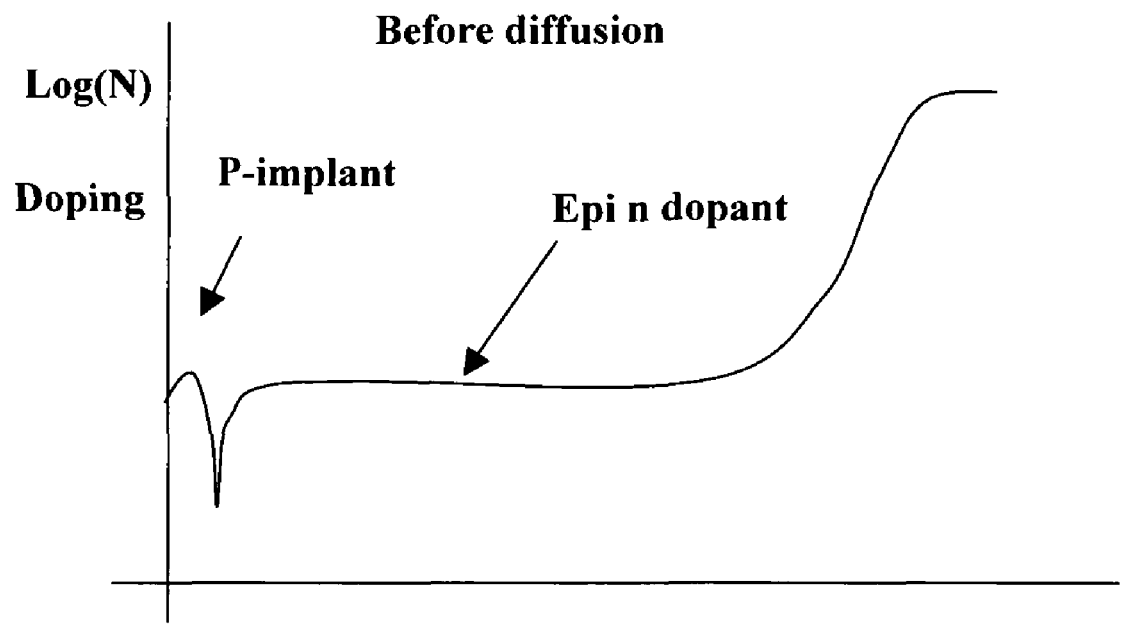
FIGS. 3C and 3D are dopant profile diagrams before and after a light body-type dopant diffusion process of a MOSFET device of this invention.
Figure 3D:
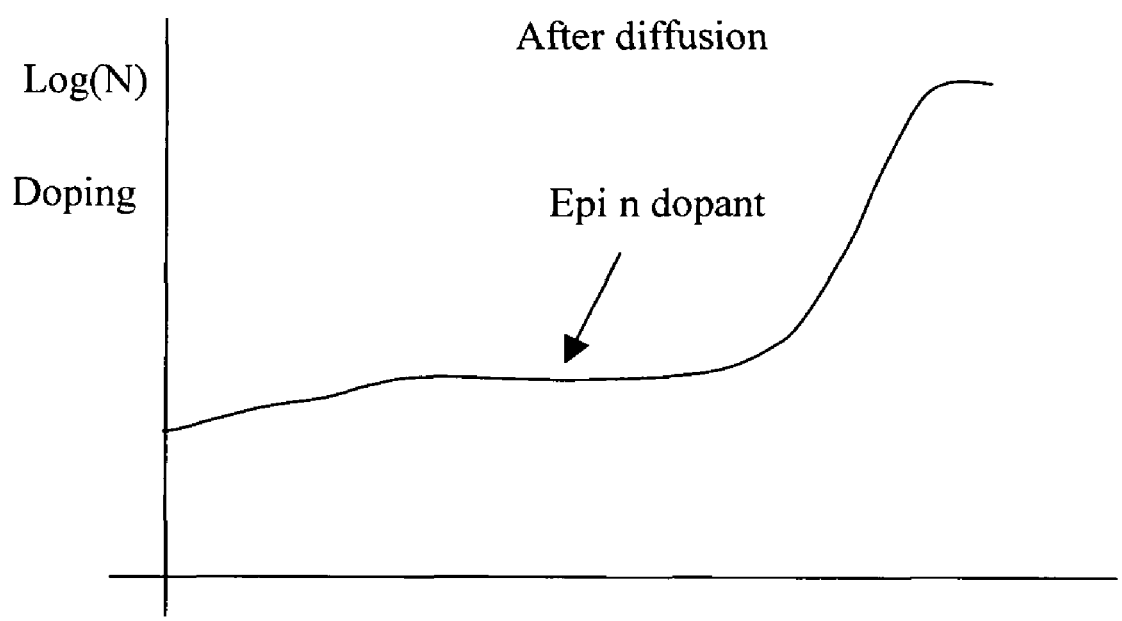
Figure 3E:
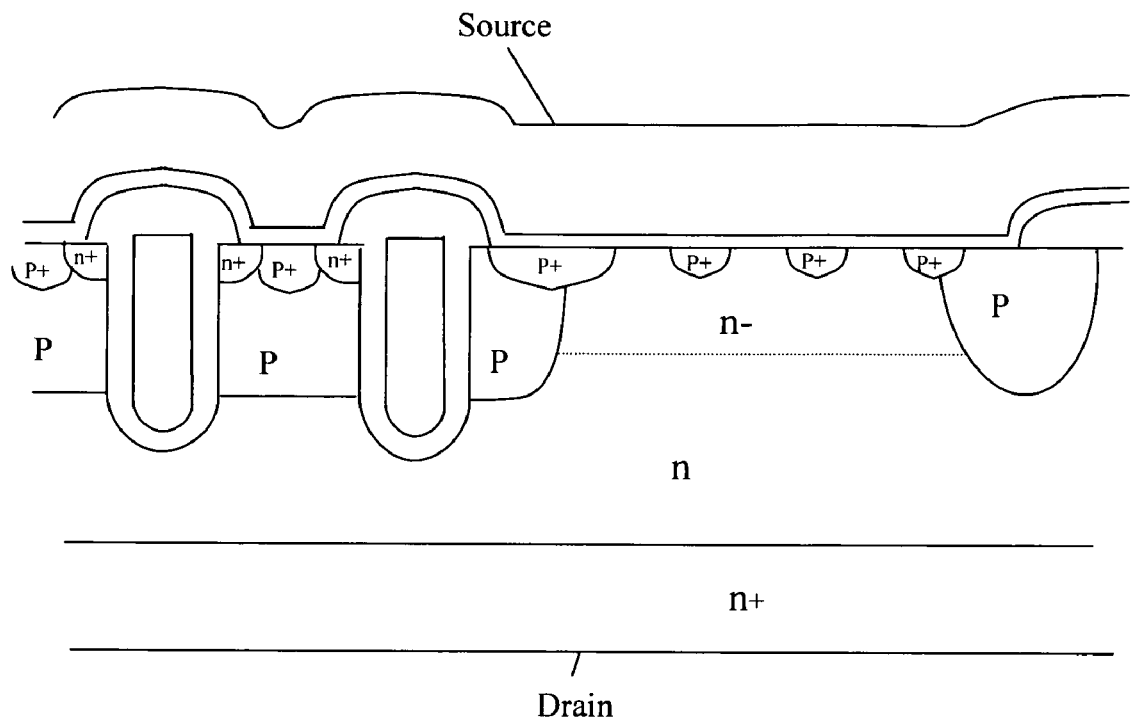
FIG. 3E is a side cross sectional view of the MOSFET device of this invention with improved breakdown voltage in the Schottky regions with the MOS mesa area unaffected.

Referring to FIGS. 3A and 3B for the side cross sectional views of the JBS area to provide the rectification function for a MOSFET device. FIG. 3A shows a blank implant of a low dose of body type dopant ions. For N channel MOSFET device, Boron ions with dosage $5 \times 10^{11}$ to $5 \times 10^{12}/cm^2$ may be implanted into the epitaxial layer with energy from 40-500 KeV, preferably with 80-300 Kev. The blank implant of the body type dopant ions is to compensate and lower the doping concentration of a portion of the epitaxial layer to increase epitaxial layer breakdown voltage. In FIG. 3B, the body dopant is then diffused by applying an elevated diffusion temperature ranging from 1000 to 1150 degrees for 1 to 3 hours to diffusion the body type dopant into a depth shallower than the depth of MOSFET body region form in a later step. The implanting body type dopant ions compensate a portion of epi dopant and generate an N− region in the epitaxial layer. This would not significantly affect the MOSFET breakdown or other performance parameter because the P− implant does not exceed the dopant concentration and boundary of MOSFET P body region, which has a higher body type ion concentration. The body type dopant implant can also be carried out after clearing the Schottky area, namely after the oxide etch for Schottky formation. In that case, it is preferred to do multiple energies to create a wider flat counter-doped n-region at the surface as there is less thermal steps in this late device manufacture stage to further spread out the P− doping region. FIG. 3C shows the dopant profile along a vertical line C-C' before the diffusion and FIG. 3D shows the dopant profile after the body type dopant diffusion process. After the diffusion, the N− region has a lower and smooth variation of dopant along the vertical direction in regions for forming Schottky junction barrier. The lower epi dopant concentration in N− region improves breakdown voltage in N− region. FIG. 3E is a cross sectional view of a MOSFET with the Schottky junction areas formed follow the processes shown in FIGS. 3A and 3B. The Schottky junction barriers are surrounded with a lightly doped N− dopant region and the upper portion of the epitaxial layer is now formed with an N− region. The breakdown in this region is increased due to lower carrier concentration. Furthermore the lower concentration in N− region helps to reduce the electrical field across the P+/N− junction although the dopant profile across the P+ Schottky pocket region may be still abrupt. The overall breakdown in Schottky area is thus increased. The light dose body type dopant implant would not affect the MOSFET active cell area because the dopant profiles in the mesa areas are not affected. The counter dopant region disposed in the JBS area having an epitaxial dopant concentration reduction ranging from 20 to 80 percent whereby performance parameters of the power transistor cell in the active cell area are not affected.

Figure 4A:
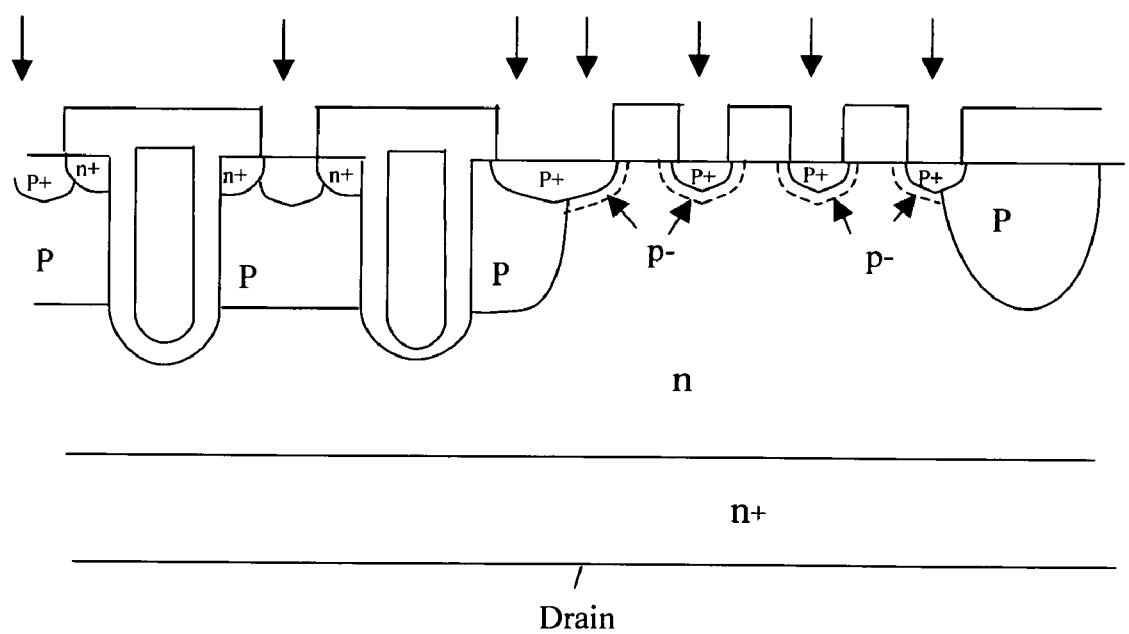
FIG. 4A is a cross sectional view of an alternate MOSFET of this invention with improved breakdown voltage and FIG. 4B is a dopant profile diagram of FIG. 4A.
Figure 4B:
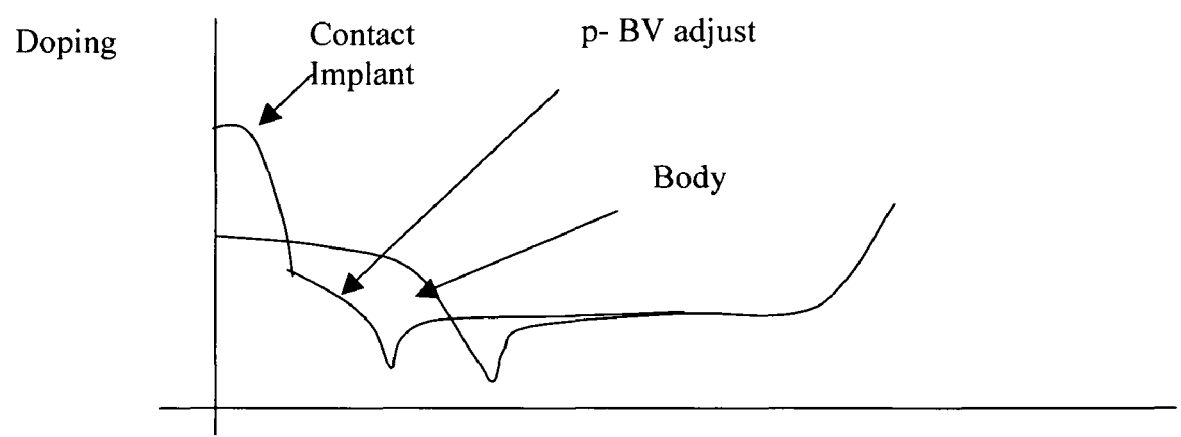

FIG. 4A is a cross sectional view of another preferred embodiment of this invention. An implantation of low dose high-energy P-type dopant ions at an energy level of about 240 to 360 kev is carried out at the time when a contact implant is carried out through the contact openings. The dose is light enough, e.g., 0.1 to $2 \times 10^{12}/cm^2$ of boron ions, to overcome the epitaxial doping and to create a P−/N− junction as shown in FIG. 4A. These P− regions surrounding the P+ Schottky pocket regions near the top surface of the epitaxial layer is sufficient to elevate the breakdown voltage in the JBS regions. In the meantime, the dose of the high-energy body dopant implant is sufficiently light, i.e., about one-tenth of a typical body implant dosage, so that the performance of the MOSFET device, other than the Schottky BV, such as the threshold voltage, is maintained the same without being affected. FIG. 4B is a doping profile of the MOSFET device along a vertical direction in the body type dopant region after the BV voltage adjustment implant compare to the MOSFET body region doping profile. As shown in FIG. 4B, the slope of P dopant concentration in Schottky P+ pocket region has been greatly changed from abrupt reversal to a gradual variation. This greatly reduces the electric field across the P-N junction in the Schottky pocket region. Furthermore, it greatly reduces the fringing electric field. As a result the premature breakdown due to abrupt dopant distribution and sharp corner are eliminated.

Figure 5A:
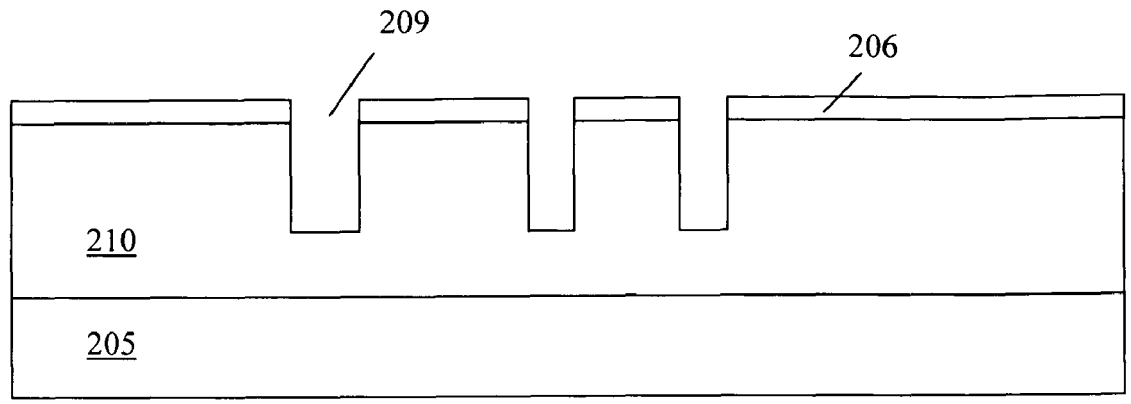
FIGS. 5A to 5K are a serial cross sectional views for describing the manufacturing processes to provide a trenched MOSFET device as shown in FIG. 4A.
Figure 5B:
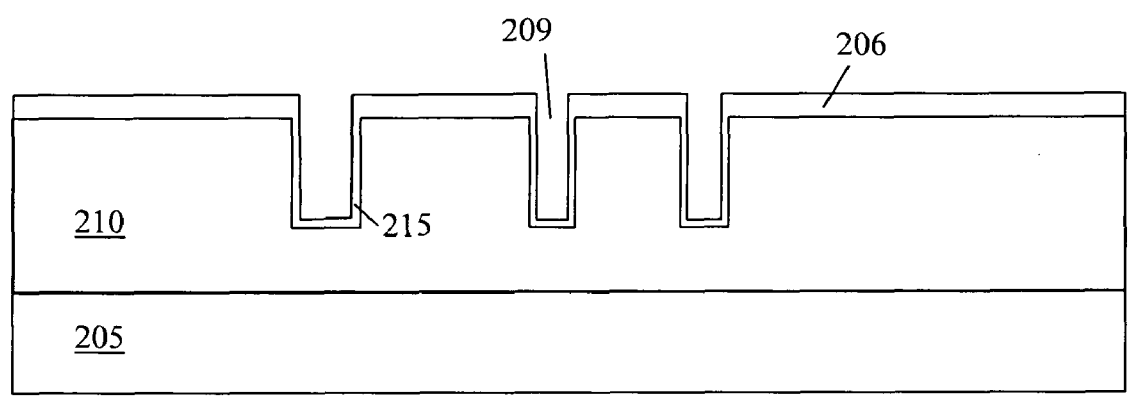
Figure 5C:
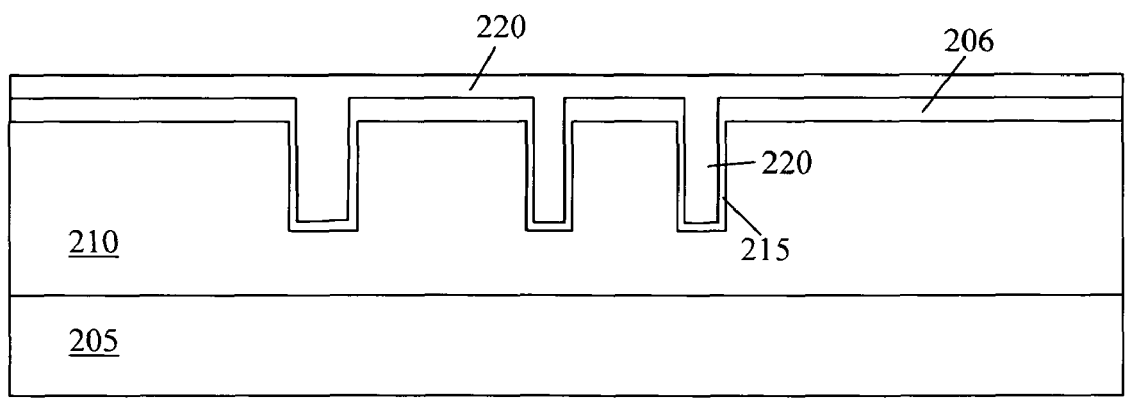

Referring to FIGS. 5A to 5K for a series of cross sectional views to illustrate the processing steps for manufacturing a MOSFET device as shown in FIG. 4A. In FIG. 5A, a trench mask (not shown) is applied as first mask to create an oxide hard mask 206 and then removed. Referring to FIG. 5B, a trench etch process is carried out to open a plurality of trenches 209 in an epitaxial layer 210 supported on a substrate 205. In FIG. 5C, a sacrificial oxidation is performed followed by an oxide etch to remove the damaged surface on the trench wall to smooth the sidewalls. Then a gate oxidation is performed to grow a gate oxide layer 215. An oxide layer 215 is grown followed by depositing a polysilicon layer 220 into the trenches.

Figure 5D:
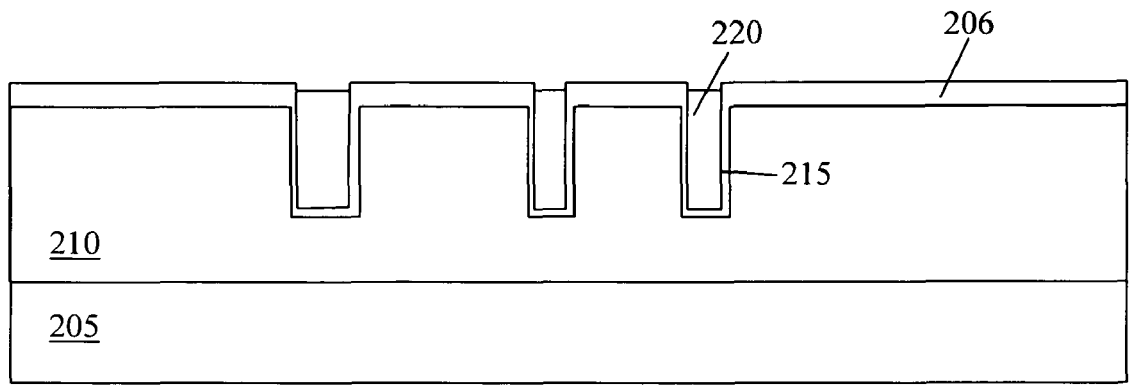
Figure 5E:
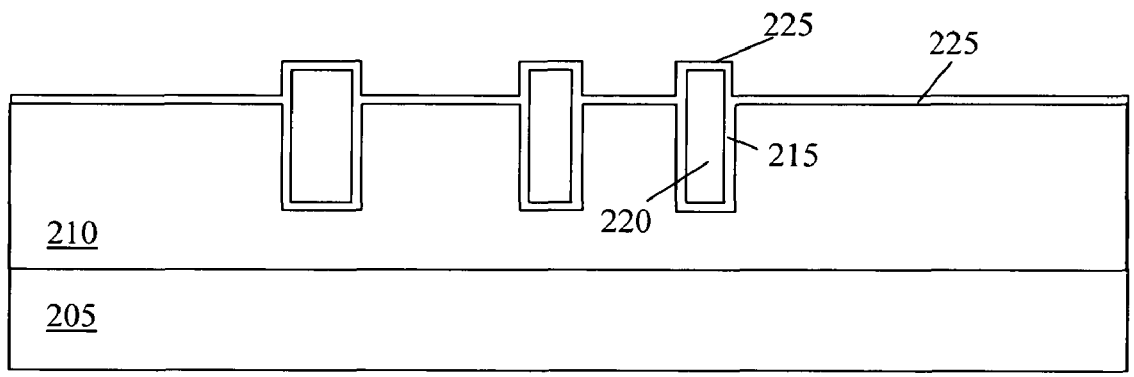
Figure 5F:
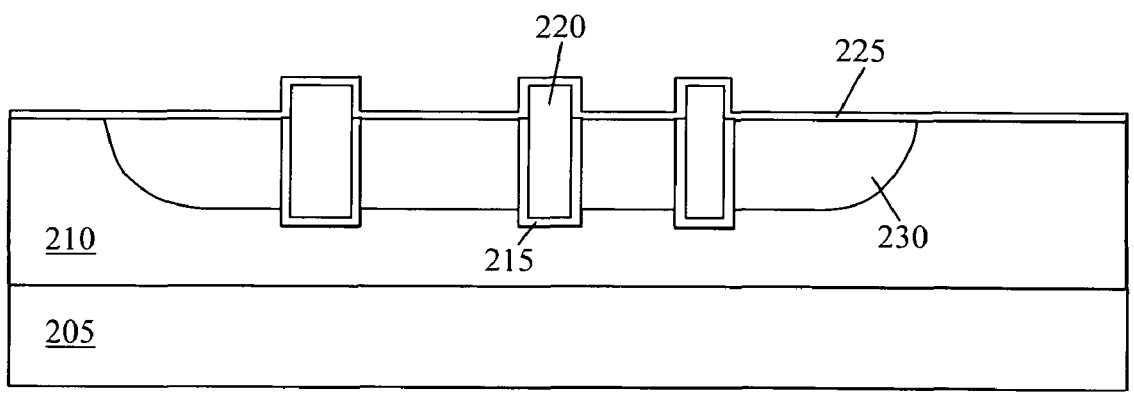
Figure 5G:
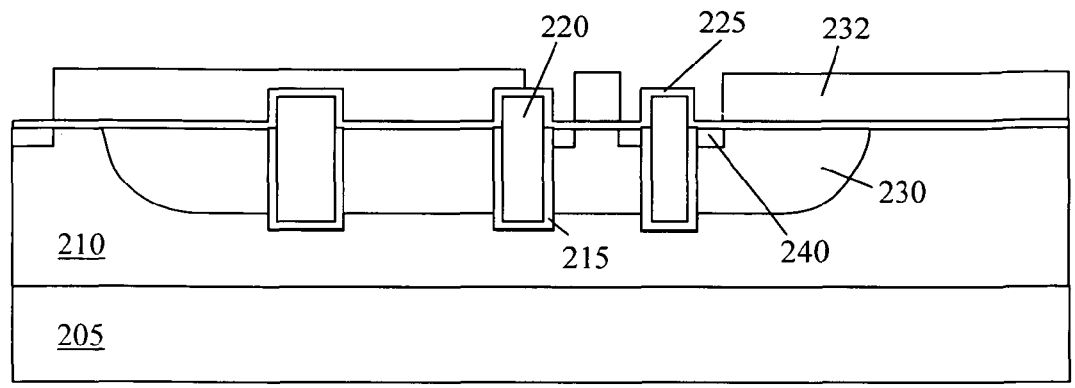
Figure 5H:
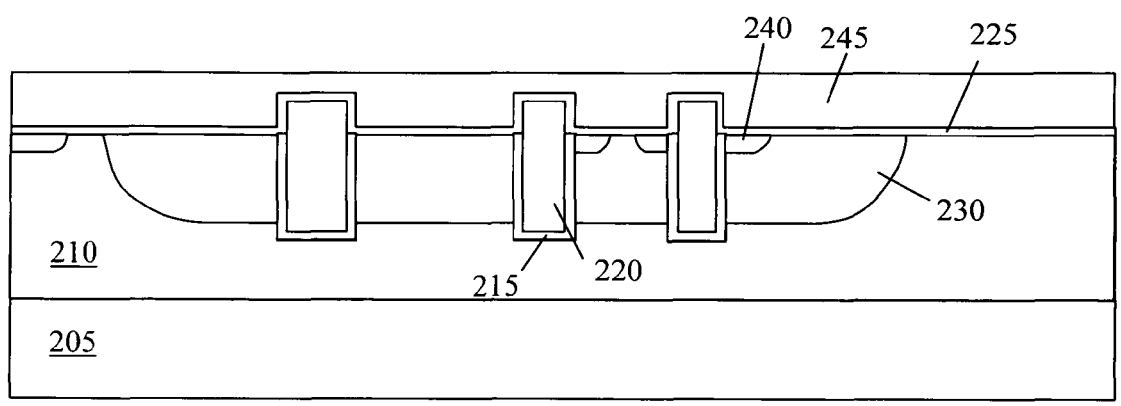
Figure 5I:
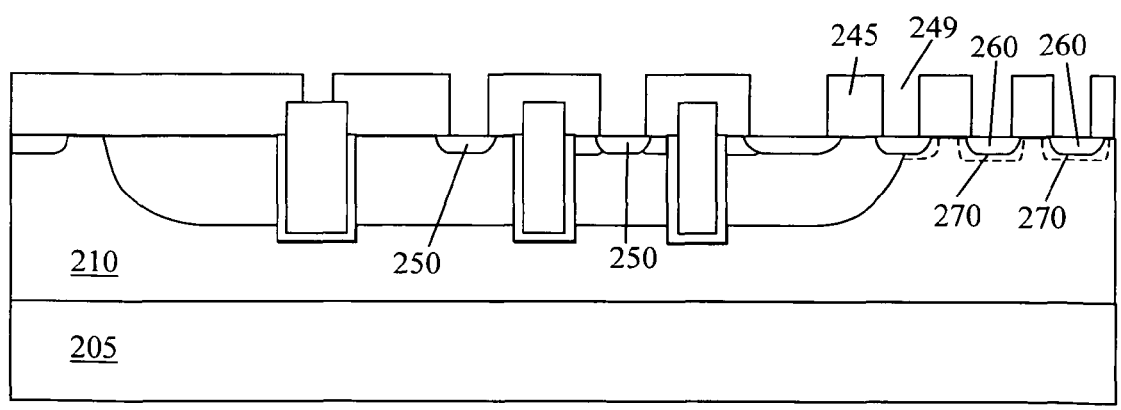

In FIG. 5D, a blanket polysilicon etch back is performed to etch back the polysilicon layer 220. The polysilicon layer 220 is etched back without a mask until it is just below the top surface of the oxide hard-mask 206. In FIG. 5E, the hard-mask 206 is etched off followed an oxide re-growth to form an oxide layer 225 on the top surface. In FIG. 5F, a body mask (not shown) is applied to implant the body dopant into the body regions followed by a diffusion process to diffuse the body regions 230 into the epitaxial layer 210. In FIG. 5G, a source mask 232 is applied for source dopant implant to form the source regions 240. In FIG. 5H, the source mask 232 is removed followed by a source drive to diffuse the source regions 240 encompassed in the body regions 230 into the epitaxial layer 210. Then an LTO/BPSG insulation layer 245 is formed on top of the MOSFET device. In FIG. 5I a contact mask (not shown) is applied to open a plurality of contact openings 249. Then a heavy body type dopant implant with does about $1-3 \times 10^{13}/cm^2$ is carried out to form the contact-enhanced body dopant regions 250 and a plurality of junction barrier Schottky P+ pocket regions 260 in the Schottky areas. Then an implantation of low dose high-energy P-type dopant ions at an energy level of about 240 to 360 kev is carried out through the contact openings 249 to form a light body dopant regions 270 surrounding the P+ pocket regions 260 as that shown in FIG. 4A. The dose is light enough, e.g., 0.1 to $2 \times 10^{12}/cm^2$ of boron ions, to overcome the epitaxial doping to create a P−/N− junction.

Figure 5J:
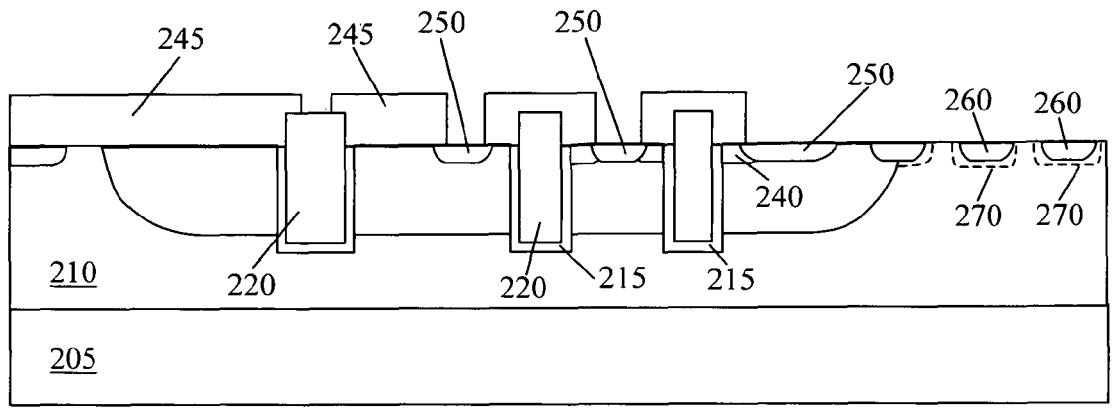
Figure 5K:
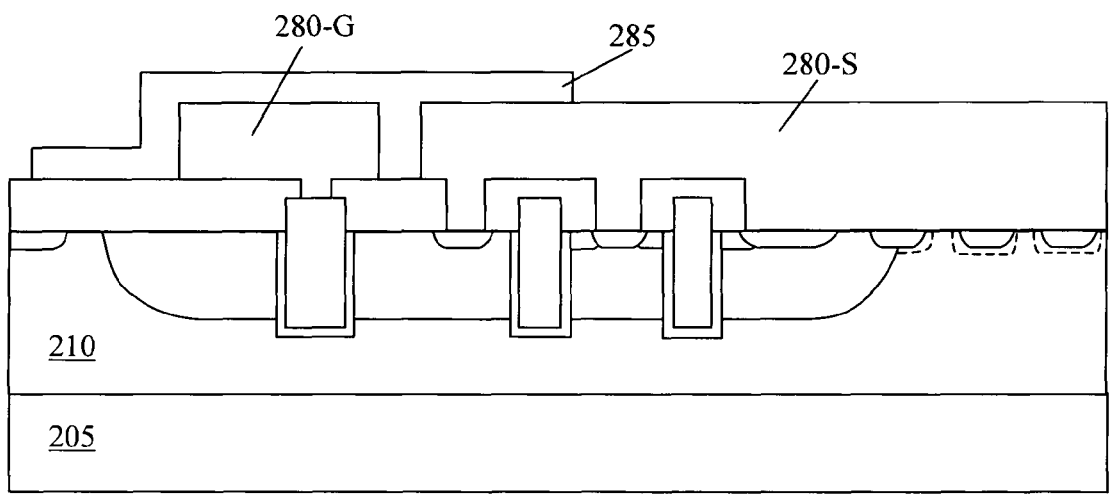

In FIG. 5J, an Schottky activation mask is applied to remove part of the insulation layer 245 from the Schottky areas. In FIG. 5K, a metal layer 280 is formed on the top surface and a metal mask (not shown) is applied to pattern the metal layer into a source metal 280-S and a gate metal 280-G followed by forming and patterning a passivation layer 285 to complete the manufacturing processes of the MOSFET device.

Figure 6A:
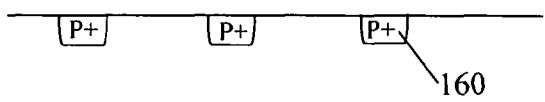
FIG. 6A is a side cross sectional view of junction barrier Schottky (JBS) rectifier and FIGS. 6B to 6E are top views showing the JBS rectifiers are implemented with stripe, square closed cells, circular closed cells and hexagonal closed cells configurations.
Figure 6B:
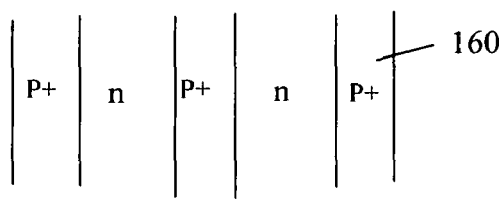
Figure 6C:
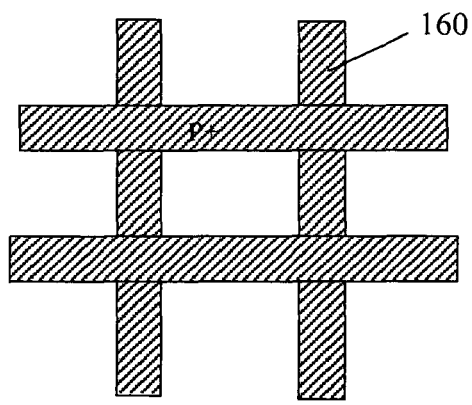
Figure 6D:
Figure 6E:
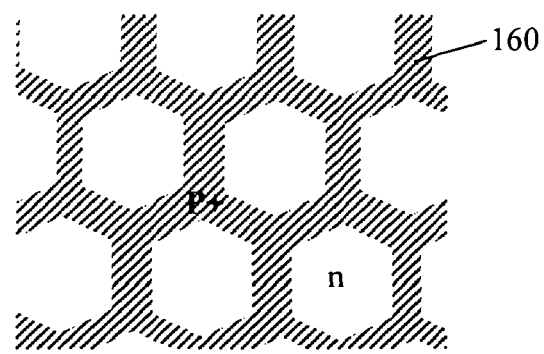

The JBS may be formed in one area or in a plurality of areas on the MOSFET die. It could also be formed in a macro cell structure where each macro cell comprises a plurality of MOSFET cells and a JBS area as in FIG. 8. Each JBS area may further form a plurality of JBS diodes in different layout. FIG. 6A is a side cross sectional view and FIGS. 6B to 6E are top views of the layout of the JBS P+ pocket regions 160 for this invention. The Schottky barrier junction regions interspersed by P+ pocket regions are implemented with different shapes in the MOSFET device. FIGS. 6B to 6E show that the Schottky junction barrier regions are formed with stripe, square closed cells, circular closed cells and hexagonal closed cells configurations respectfully.

Figure 7:
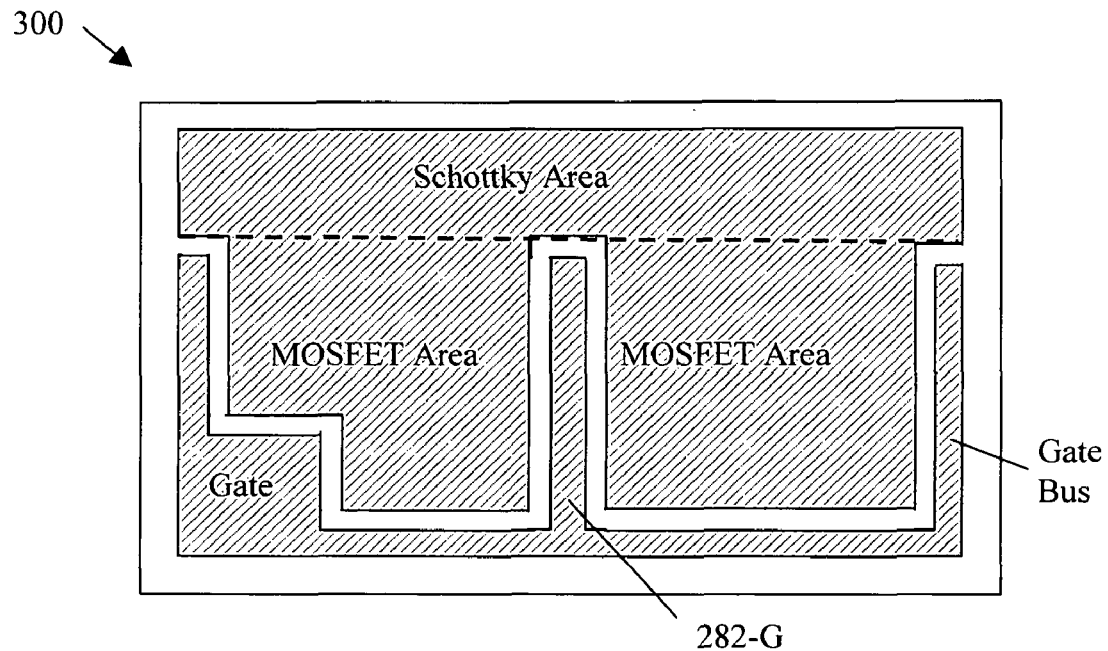
FIG. 7 is a top view of a MOSFET device where the Schottky area is maximized by not running the peripheral gate bus all the way around the die with the gage fingers formed as a comb shape with a bottom peripheral gate runner.
Figure 8:
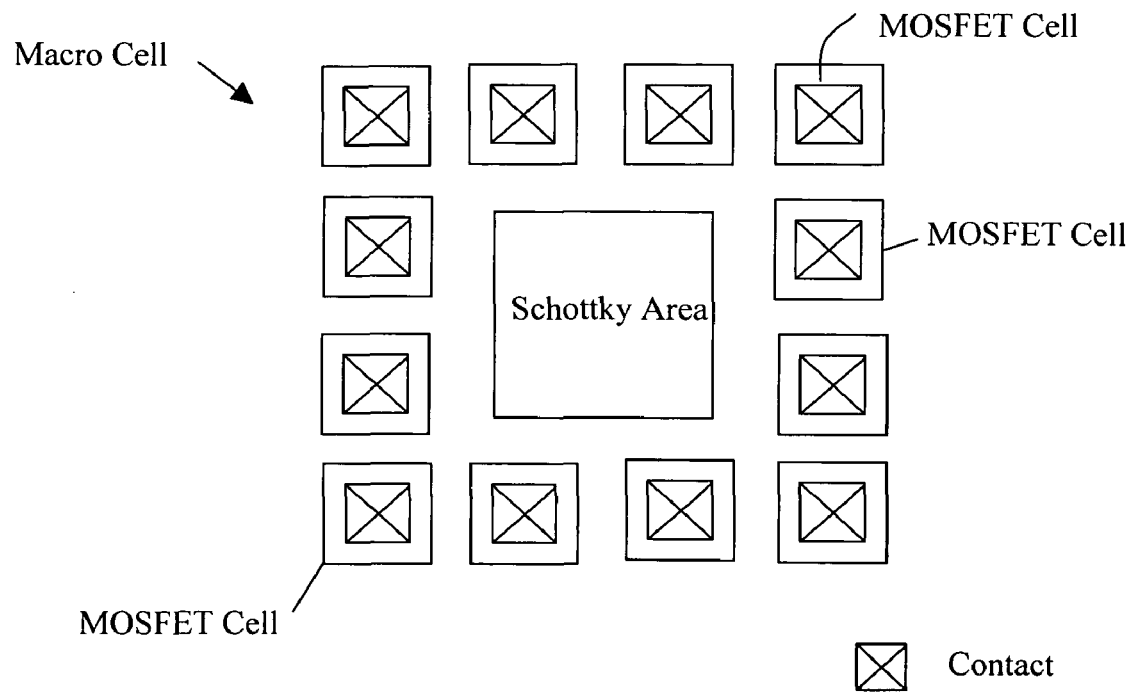
FIG. 8 is a top view of a MOSFET device where the Schottky area is formed within a macro cell structure.
Figure 8A:
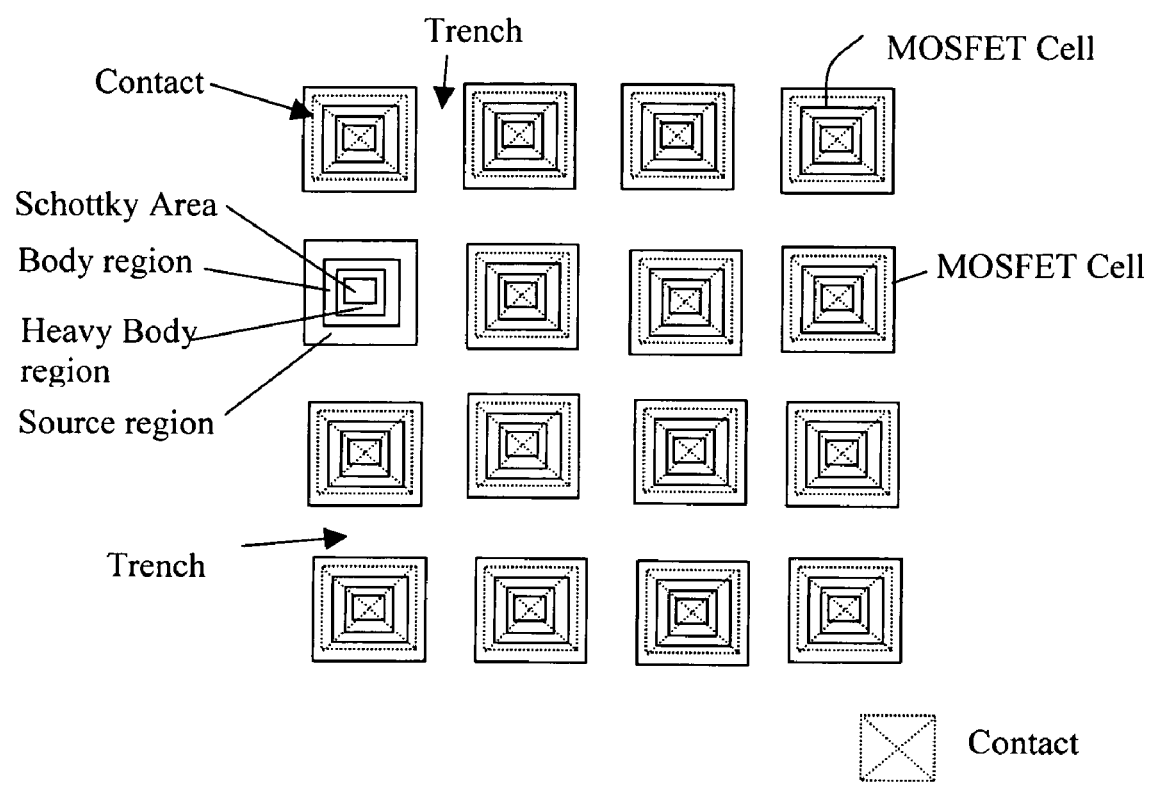
FIG. 8A is a top view of a MOSFET device where an Schottky area is formed within each MOSFET cell structure.

FIG. 7 is a top view of a MOSFET device 300 where the Schottky area is maximized by not running the peripheral gate bus all the way around the die with the gate fingers 282-G formed as a comb shape with a bottom peripheral gate runner. Referring to FIG. 8 for a top view of a MOSFET device where the Schottky area is formed within a macro cell structure. FIG. 8A is a close cell layout of a MOSFET active cells where each MOSFET cell surrounded by a trench comprises a Schottky contact area surrounded by a P+ doped region functioning as Schottky pocket region. Due to its periodic symmetry, a MOSFET cell may be defined as surrounded by the trench or center at the trench (as easier to understand in cross sectional figures).

Figure 9:
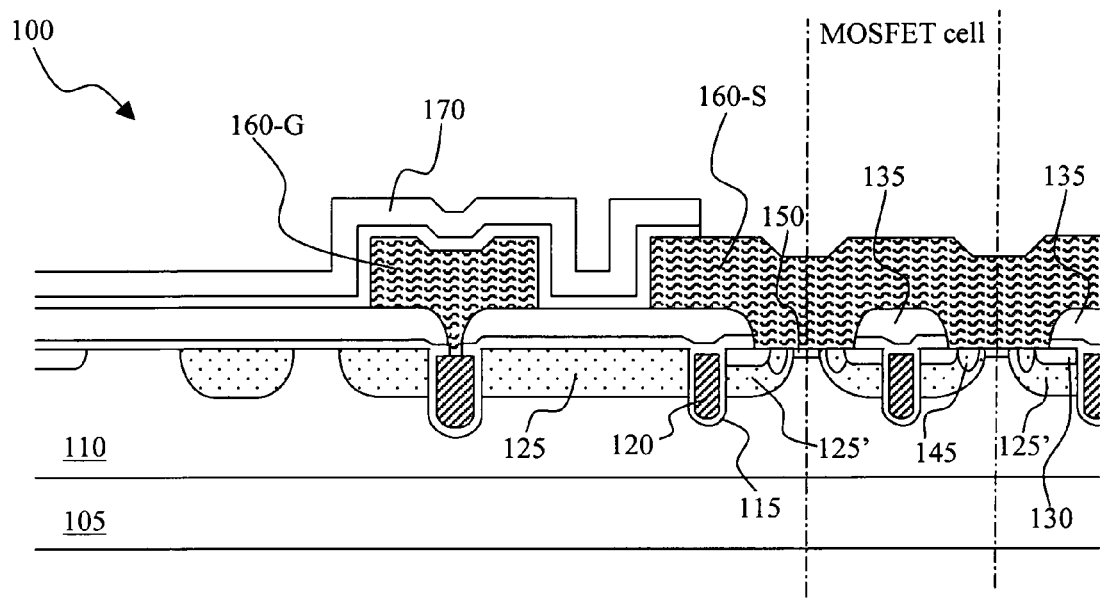
FIG. 9 is a cross sectional view of a MOSFET integrated with an Schottky in every cell of this invention.

Referring to FIG. 9 for a side cross sectional view of a MOSFET device 100 manufactured according to the processes described in FIGS. 10A to 10J below of this invention. The MOSFET device 100 may be a close cell structure as FIG. 8A. The MOSFET device 100 is formed on a semiconductor substrate 105 supporting an epitaxial layer 110 thereon with a bottom surface functioning as a drain electrode. The MOSFET device 100 includes a plurality of trench gates 120 disposed in trenches padded with gate oxide layer 115. The MOSFET device 100 further includes a plurality of body regions 125 in the termination area and gapped body regions 125' in the active cell areas. The body regions 125 and the gapped body regions 125' surround the trench gates 120 and the gapped body regions 125' encompass the source regions 130 therein. An insulation layer 135 covering the top surface with contact openings to form the source contact metal layer 160-S and gap metal 160-G. The source metal 160-S contacts the source regions 130 and body regions 125' and forms an Schottky contacts between the metal layer and the underneath semiconductor at the gaps between body regions 125'. The MOSFET device 100 further includes heavy body regions 145 functioning as body doped contact regions disposed between the outer edge of source regions 130 and the outer edge of body regions 125'. Heavy body regions 145 further functioning as heavy doped Schottky pocket regions surrounding the Schottky diode to form Junction Barrier Controlled Schottky (JBS). In one embodiment, heavy body regions 145 extend from the outer edge of source regions 130 to the outer edge of body regions 125'. In another embodiment, the heavy body regions 145 are disposed immediately next to the outer edge of the source regions 130 within the body regions 125' and extend close to but not reaching the outer edge of the body region 125' near the gaps between the gapped body regions 125'. The lightly body type doping at the outer edge of body regions 125' surrounding heavy doped Schottky pocket regions 145 improves the breakdown in JBS regions. The heavy body regions 125' are preferably extent to a depth deeper than the source regions to provide anti-punch through function therefore improving device robustness. The Schottky contact regions 150 may further include a barrier height adjustment layer formed by Shannon implant in the open areas between the gapped body regions 125' for adjusting a leakage current of Schottky diode. The gate metal 160-G contact the trench gate 120 in the termination area wherein all the trench gates including the trench gates 120 in the active areas are interconnected via trenches opened in the semiconductor substrate filled with polysilicon gate material. The MOSFET device 100 further includes a passivation layer 170 to cover the gap metal with the top surface of the source metal 160-S exposed and ready for external connection.

Figure 10A:
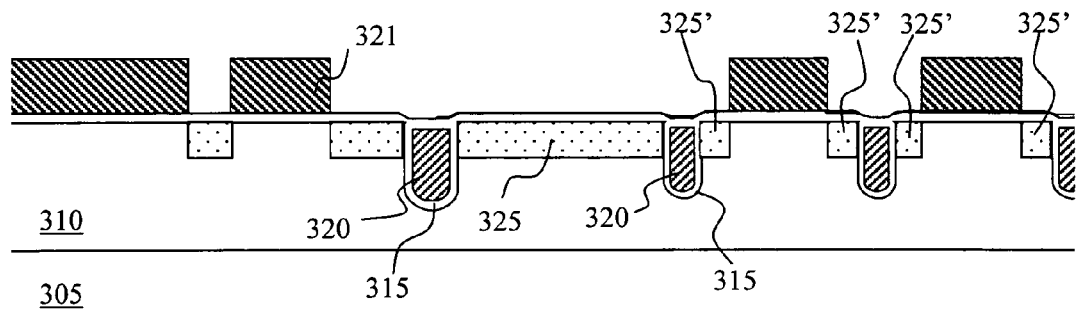
FIGS. 10A to 10J are a serial cross sectional views for describing the manufacturing processes to provide a trenched MOSFET device as shown in FIG. 9.
Figure 10B:
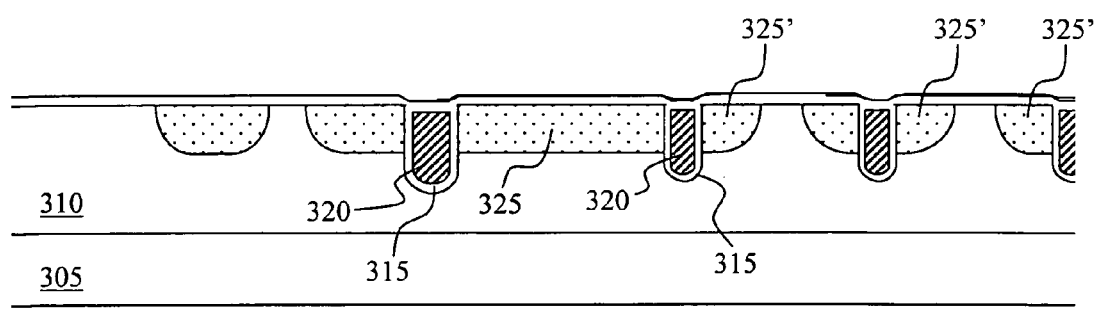

Referring to FIGS. 10A to 10J for a series of cross sectional views to illustrate the processing steps for manufacturing a MOSFET device as shown in FIG. 4. In FIG. 10A, a trench mask (not shown) is applied to open a plurality of trenches followed by processes of gate oxide formation to form the gate oxide layer 315 and filling the trenches with polysilicon to form a plurality of trench gates 320 in an epitaxial layer 310 supported on a semiconductor substrate 305. A photo resist layer 321 is applied as body mask to carry out a body dopant implant to form the body regions 325 surrounding the trench gates 320. The body mask is specially configured such that the body regions 325' in the active cell region is only implanted immediately adjacent to the trench gates 320 with a gap in the middle portions between the trench gates 320 while the body region 325 is implanted to extend continuously between the gates 320 near the termination area. In FIG. 10B, the body mask 321 is removed and a body diffusion operation is carried out to diffuse the body regions 325 and 325'. There are still gaps between the body regions 325' in the active cell areas. Alternatively, an optional body type implant may be carried out and diffused as the process described in FIGS. 3A-3B without mask to create a doping profile of FIG. 3D before the formation of body regions.

Figure 10C:
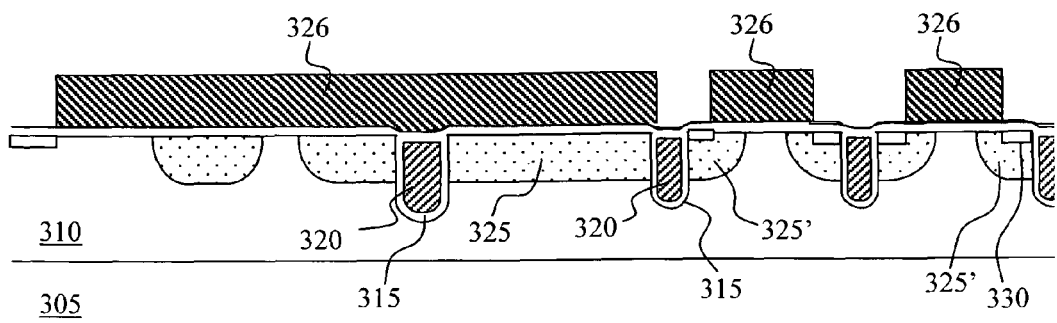
Figure 10D:
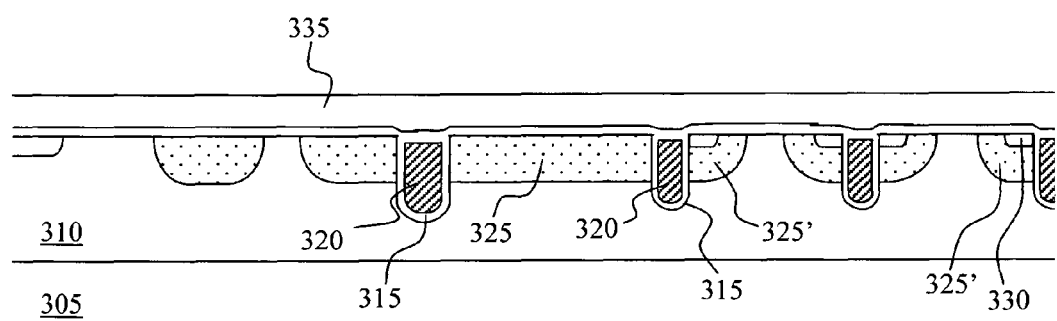
Figure 10E:
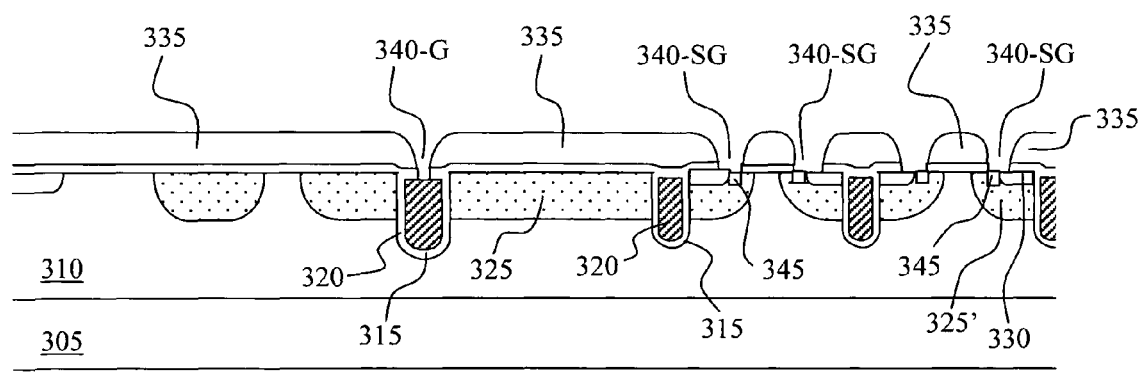
Figure 10F:
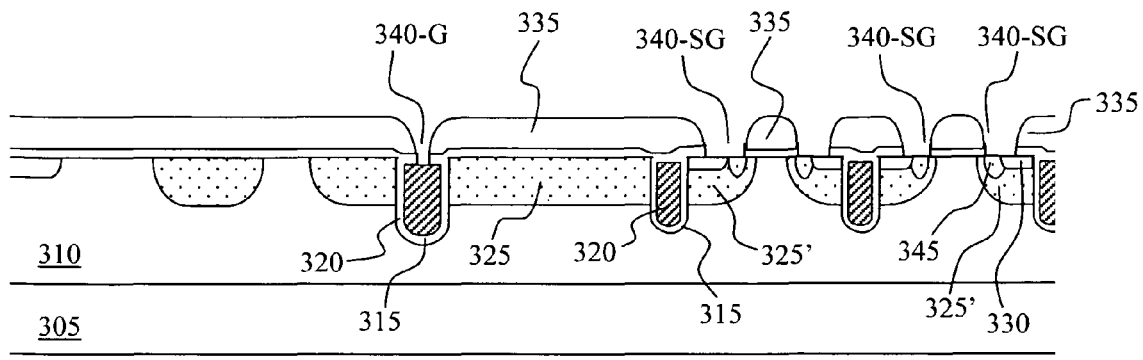

In FIG. 10C, a source mask 326 is applied to carry out a source implant to form the source regions 330 within and encompassed by the body regions 325'. Then the source mask 326 is removed and an elevated temperature is applied to activate the source regions 330. In FIG. 10D, a BPSG deposition process is carried out to form an insulation layer 335 to cover the top surface of the device. In FIG. 10E, a contact mask (not shown) is applied to open specially configured contact openings. There are contact openings 340-G opened above the trench gate 320 in the termination area to form the gate metal contact there. There are source/body contact openings 340-SB formed above the source/body regions. A heavy body contact implant is carried out to form contact dopant regions 345 between the source regions 330 and the outer edge of body regions 325'. The source/body contact openings 340-SB is preferably configured such that contact implant dopant regions 345 do not extend to the outer edge of the body regions 325'. Multiple implants with different energy level may be carried out to form a deep heavy body implant without much lateral expansion. In one embodiment, the heavy body implant is carried out by a first implantation of BF2 at a energy level between 40-80 Kev at a dosage of 1-3 E15/cm2, followed by a second implant of Boron at an energy level between 40-80 Kev at a dosage of 1-3 E15/cm2. In another embodiment single implant of BF2 with energy between 40-120 Kev at a dosage of 1-5 E15/cm2 is used. In FIG. 10F, the contact mask (not shown) is removed and a contact implant activation process is carried out with a temperature ranging from 800 to 1100 degrees for a period from 30 seconds to 30 minutes depending on the implant condition and activation temperature. Preferably RTP (Rapid Thermal Process) is used to activate the contact implant to minimize lateral diffusion.

Figure 10G:
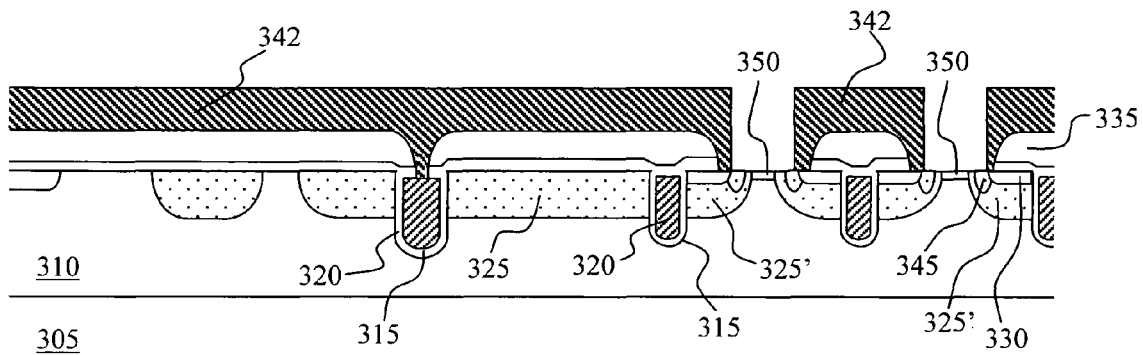
Figure 10H:
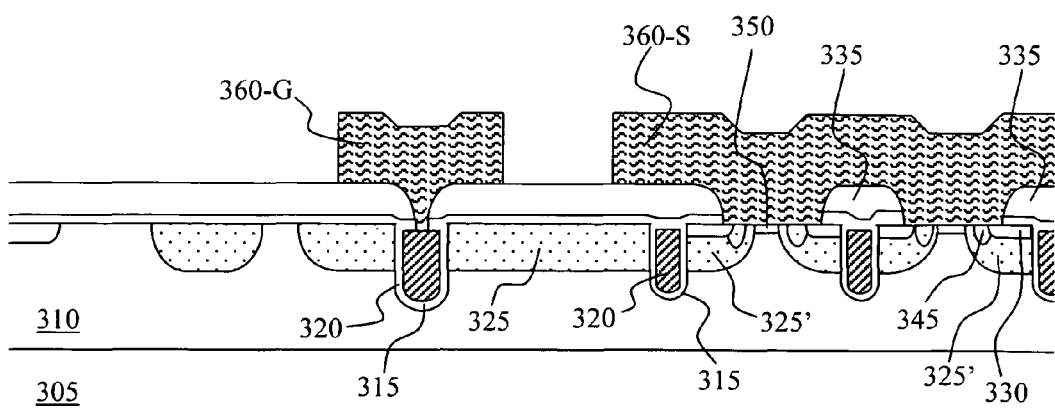
Figure 10I:
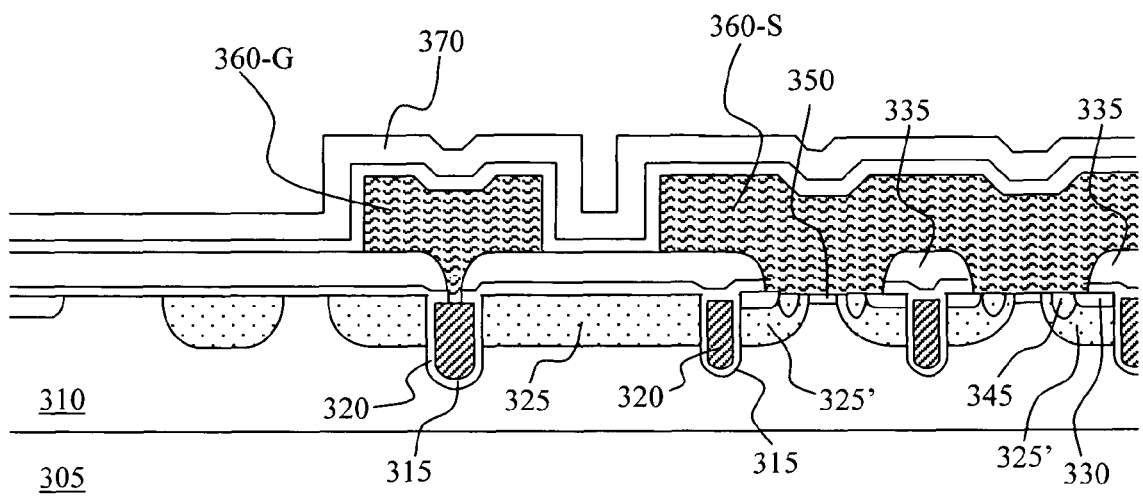
Figure 10J:
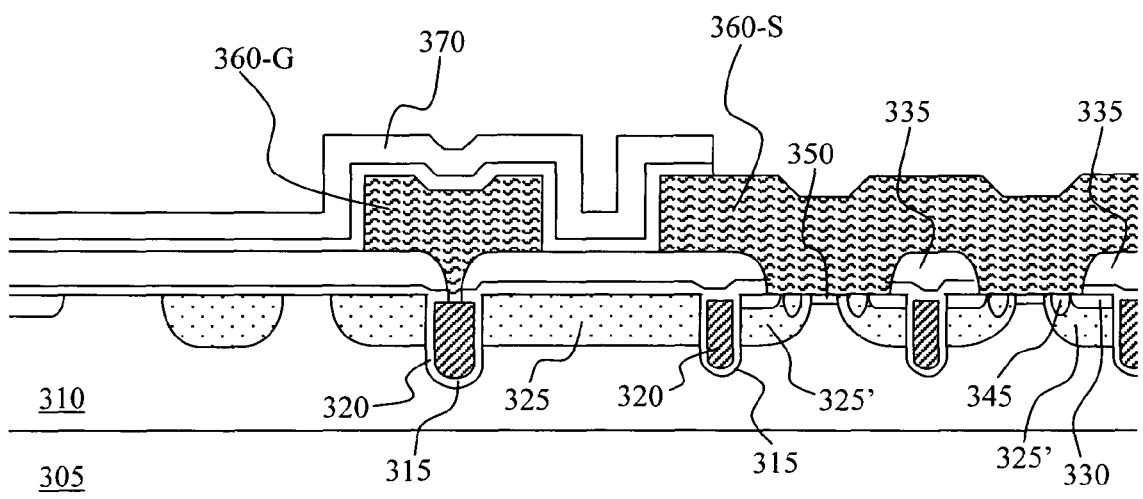

In FIG. 10G, an Schottky mask 342 is applied to carry out an oxide etch to remove the insulation layer 335 from the top surface between the gaps of the body regions 325'. Then a shallow Shannon dopant implant is carried out with either boron or BF2 ions having an ion flux in a range substantially between 2e11~1e13 and with an implanting energy in a range substantially between 10-80 keV. The shallow ion implant process is carried out to form a Shannon implant region 350 on top of the epitaxial layer 310 between the body regions 325' thus functioning as an Schottky barrier height adjustment layer in each and every active MOSFET cells. In FIG. 10H, the Schottky mask 342 is removed and a metal deposition is carried out followed by applying a metal mask (not shown) to pattern the metal layer into gate metal 360-G and the source/body metal 360-S contacting the source regions 330, body regions 325' through heavy contact dopant regions 345 immediately next to the source and the shallow Shannon implant regions 350. In FIG. 10I, a passivation layer 370 is deposited over the entire surface of the device and in FIG. 10J, a passivation mask (not shown) is applied to remove part of the passivation layer 370 to expose the source metal 360-S.

According to the above descriptions, this invention discloses a semiconductor power device. The semiconductor power device includes an active cell area that has a plurality of power transistor cells. Each of the power transistor cells includes a Schottky diode that further comprises a Schottky junction barrier metal disposed above a Shannon implant region within a gap between separated body regions of two adjacent power transistor cells for adjusting a leakage current of the Schottky diode. In an exemplary embodiment, the semiconductor power device further includes heavy body doped regions in the separated body regions next to source regions surrounding the Schottky diode forming a junction barrier Schottky (JBS) pocket region. In another exemplary embodiment, each of the heavy body doped regions further surrounded by a lightly body doped region as part of the separated body regions for improving the breakdown of the JBS regions. In another exemplary embodiment, the separated body regions further includes a heavy doped body region near a bottom of the separated body regions for providing an anti-punch through function of the semiconductor power device for improving a device robustness. In another exemplary embodiment, each of the power transistor cells further includes heavy body doped regions in the separated body regions next to source regions extending from the source regions to outer edges of the separated body regions for surrounding the Schottky diode forming a junction barrier Schottky (JBS) region. In another exemplary embodiment, each of the power transistor cells further includes heavy body doped regions in the separated body regions next to the source regions extending from the source regions to a region near outer edges but within the separated body regions for surrounding the Schottky diode forming a junction barrier Schottky (JBS) region. In another exemplary embodiment, the Shannon implant region includes a BF2 Shannon implant region.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A semiconductor power device comprising an active cell area having a plurality of power transistor cells supported on a semiconductor substrate, wherein:
    said power transistor cells are integrated and functioning together with a plurality of Schottky diodes disposed in areas between said power transistor cells on said semiconductor substrate wherein said Schottky diodes disposed between said active transistor cells comprise separated body dopant regions near a top surface of said semiconductor substrate cover under a Schottky junction barrier metal and wherein said separated body dopant regions are disposed in an upper source dopant layer on top of a lower source dopant layer in said semiconductor substrate and wherein said upper source dopant layer having a smaller dopant concentration than said lower source dopant layer and having an opposite conductivity type from said separated body dopant regions; and
    each of said power transistor cells comprising a trenched gate surrounded by a body region encompassing a source region therein and one of said separated body dopant regions is disposed in an outer upper edge in one of said body regions as a junction barrier Schottky (JBS) body region of one of said power transistor cells wherein said JBS body region disposed next to said Schottky diodes has no source region encompassed therein.

2. The semiconductor power device of claim 1 wherein:
    each of said separated body dopant regions is further surrounded by a lightly body dopant region with a body dopant concentration lower than said separated body dopant regions.

3. The semiconductor power device of claim 1 wherein:
    said upper source dopant layer with said smaller source dopant concentration than said lower source dopant layer extends in said semiconductor substrate to a depth above a bottom of the body regions of said power transistor cells.

4. The semiconductor power device of claim 1 wherein:
    said power transistor cells are configured to surround an area as a junction barrier Schottky (JBS) pocket region with said separated body dopant regions disposed therein surrounded by said power transistor cells and covered by said Schottky junction barrier metal on top of said semiconductor substrate.

5. The semiconductor power device of claim 1 wherein each of said power transistor cells further comprising:
    said power transistor cells comprising MOSFET transistor cells and configured to surround an area as a junction barrier Schottky (JBS) pocket region with said separated body dopant regions disposed therein surrounded by said MOSFET transistor cells and covered by said Schottky junction barrier metal on top of said semiconductor substrate.

6. The semiconductor power device of claim 1 wherein said upper source dopant layer comprises a boron dopant layer.

7. The semiconductor power device of claim 1 wherein:
    said upper source dopant layer and said lower source dopant layer further comprise an epitaxial layer having the smaller and greater source dopant concentration respectively disposed in said semiconductor substrate.

8. A semiconductor power device comprising an active cell area having a plurality of power transistor cells supported on a semiconductor substrate, wherein:
    said power transistor cells are configured to surround a semiconductor area as a junction barrier Schottky (JBS) pocket region to form a plurality of planar Schottky diodes therein each comprising a separated body dopant region covered under a Schottky junction barrier metal on top of said semiconductor substrate; and
    each of said power transistor cells comprising a trenched gate surrounded by a body region encompassing a source region therein and one of said separated body dopant regions is disposed in an outer upper edge in one of said body regions as a junction barrier Schottky (JBS) body region of one of said power transistor cells wherein said JBS body region disposed next to said Schottky diodes has no source region encompassed therein.

9. The semiconductor power device of claim 8 wherein:
    said separated body dopant regions are disposed in an upper source dopant layer on top of a lower source dopant layer in said semiconductor substrate and wherein said upper source dopant layer having a smaller dopant concentration than said lower source dopant layer and having an opposite conductivity type from said separated body dopant regions.

10. The semiconductor power device of claim 9 wherein: said upper source dopant layer with said smaller source dopant concentration than said lower source dopant layer extends in said semiconductor substrate to a depth above a bottom of the body regions of said power transistor cells.

11. The semiconductor power device of claim 9 wherein said upper source dopant layer comprises a boron dopant layer.

12. The semiconductor power device of claim 9 wherein: said upper source dopant layer and said lower source dopant layer further comprise an epitaxial layer having the smaller and greater source dopant concentration respectively disposed in said semiconductor substrate.

13. The semiconductor power device of claim 8 wherein: each of said power transistor cells comprising a trenched gate surrounded by a body region encompassing a source region therein and said power transistor cells disposed adjacent to said JBS pocket region comprising said body region having no source region encompassed therein.

14. The semiconductor power device of claim 8 wherein: each of said separated body dopant regions is further surrounded by a lightly body dopant region with a body dopant concentration lower than said separated body dopant regions.

15. The semiconductor power device of claim 8 wherein: said upper source dopant layer with said smaller source dopant concentration than said lower source dopant layer extends in said semiconductor substrate to a depth above a bottom of the body regions of said power transistor cells.

16. The semiconductor power device of claim 8 wherein: said semiconductor power device comprising a plurality of metal oxide field effect transistor (MOSFET) cells.

17. A semiconductor power device comprising:
a semiconductor substrate supports an epitaxial layer having a gradually increasing dopant concentration along a vertical direction having a lighter dopant concentration near a top surface of said epitaxial layer;
an active cell area having a plurality of power transistor cells configured to surround a semiconductor area as a junction barrier Schottky (JBS) pocket region to form a plurality of a planar Schottky diodes therein each comprising a separated body dopant region formed near the top surface of said epitaxial layer surrounded by said epitaxial layer having the lighter dopant concentration and covered under a Schottky junction barrier metal on top of said semiconductor substrate; and
each of said power transistor cells comprising a trenched gate surrounded by a body region encompassing a source region therein and one of said separated body dopant regions is disposed in an outer upper edge in one of said body regions as a junction barrier Schottky (JBS) body region of one of said power transistor cells wherein said JBS body region disposed next to said Schottky diodes has no source region encompassed therein.

18. The semiconductor power device of claim 17 further comprising:
a Shannon implant region disposed in a gap between said separated body dopant regions of two adjacent power transistor cells.

* * * * *